US008816341B2

(12) United States Patent
Kim et al.

(10) Patent No.: US 8,816,341 B2
(45) Date of Patent: Aug. 26, 2014

(54) ORGANIC ELECTROLUMINESCENT DISPLAY AND METHOD OF MANUFACTURING THE SAME (71) Applicant: Samsung Display Co., Ltd., Yongin (KR)

(72) Inventors: Jang Sub Kim, Suwon-si (KR); SungWoong Kim, Suwon-si (KR); Jae Hoon Kim, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 13/914,400

(22) Filed: Jun. 10, 2013

(65) Prior Publication Data
US 2014/0077182 A1 Mar. 20, 2014

(30) Foreign Application Priority Data
Sep. 17, 2012 (KR) .................. 10-2012-0103014

(51) Int. Cl.
H01L 51/54 (2006.01)
H01L 51/56 (2006.01)

(52) U.S. Cl.
USPC ...... 257/40; 257/88; 257/E51.018; 257/E51.024; 438/34

(58) Field of Classification Search
None
See application file for complete search history.

(56) References Cited

U.S. PATENT DOCUMENTS

2002/0155215 A1 10/2002 Miyashita et al.
2006/0105148 A1* 5/2006 Cok et al. .................. 428/195.1
2007/0239801 A1 10/2007 Lee et al.
2008/0030119 A1* 2/2008 Ito et al. ..................... 313/483
2008/0309232 A1* 12/2008 Yamamoto ................. 313/505
2010/0127273 A1* 5/2010 Kim ............................. 257/72
2010/0193794 A1* 8/2010 Kim et al. ..................... 257/59
2014/0034941 A1* 2/2014 Fennimore et al. ........... 257/40

FOREIGN PATENT DOCUMENTS

JP         10-153967        6/1998
KR       10-0637178 A     10/2006
KR    10-2012-0042433 A    5/2012

OTHER PUBLICATIONS

Definition of lyophilic downloaded from URL<http://www.merriam-webster.com/dictionary/lyophilic> on Apr. 15, 2014.*
Crankshaw, M., et. al., "Fundametal Issues with IJP P-OLED Devices: Indentification and Corrective Actions", SID Los Angeles May 20, 2011.*
Dupont OLED Technology Enables Next-Generation, Large-Format Displays with Significant Manufactruing Cost Savings, downloaded from URL<http://www.dupont.com/content/dam/assets/products-and-services/display-lighting-materials/assets/DEC-DuPont_OLED_Technology.pdf> on Apr. 15, 2014.*
Chesterfield, R., et. al., "Solution-Coating Technology for AMOLED Displays" Information Display Jan. 11, 2011 pp. 24-30.*
Korean Patent Abstracts Publication No. KR10-2006-0032099 dated Apr. 14, 2006, cited for KR10-0637178 A, 1 page.

* cited by examiner

Primary Examiner — Thomas L Dickey
Assistant Examiner — Joseph Schoenholtz
(74) Attorney, Agent, or Firm — Christie, Parker & Hale, LLP (57) ABSTRACT An organic electroluminescent display includes a substrate having a pixel area, a pixel definition layer having an opening corresponding to the pixel area, a pixel electrode in the pixel area, a hole injection layer on the pixel electrode, a conductive primer layer in the opening and on the hole injection layer, the conductive primer layer being more lyophilic than the hole injection layer, a hole transfer layer in the opening and on the conductive primer layer, an organic light-emitting layer on the hole transfer layer, and a common electrode on the organic light-emitting layer.

14 Claims, 8 Drawing Sheets

ORGANIC ELECTROLUMINESCENT DISPLAY AND METHOD OF MANUFACTURING THE SAME

CROSS-REFERENCE TO RELATED APPLICATION

This application claims priority to and the benefit of Korean Patent Application No. 10-2012-0103014, filed on Sep. 17, 2012, the contents of which are hereby incorporated by reference.

BACKGROUND

1. Field

Embodiments of the present invention relate to an organic electroluminescent display and a method of manufacturing the same.

2. Description of the Related Art

In recent years, organic electroluminescent displays have been spotlighted as a next generation display device, because they have superior brightness and viewing angle, and because they do not need a separate light source, unlike a liquid crystal display device. Accordingly, the organic electroluminescent display has advantages of being slim and lightweight. In addition, the organic electroluminescent display has comparatively fast response speed, low driving voltage, high brightness, etc.

In general, the organic electroluminescent display includes an anode electrode, a cathode electrode, a hole injection layer, a hole transfer layer, an organic light-emitting layer, an electron transfer layer, and an electron injection layer. Holes and electrons are injected into the organic emitting layer through the anode electrode and the cathode electrode, respectively, and are recombined in the organic light-emitting layer to generate excitons (electron-hole pairs). The excitons emit energy as light, which is discharged when the excitons return to a ground state from an excited state.

SUMMARY

Embodiments of the present invention provide an organic electroluminescent display having a structure suitable for manufacture.

Embodiments of the present invention provide a method of manufacturing the organic electroluminescent display.

Embodiments of the present invention provide an organic electroluminescent display including a substrate having a pixel area, a pixel definition layer having an opening corresponding to the pixel area, a pixel electrode in the pixel area, a hole injection layer on the pixel electrode, a conductive primer layer in the opening and on the hole injection layer, the conductive primer layer being more lyophilic than the hole injection layer, a hole transfer layer in the opening and on the conductive primer layer, an organic light-emitting layer on the hole transfer layer, and a common electrode on the organic light-emitting layer.

The conductive primer layer may be entirely within the opening.

The hole transfer layer may be on an entirety of the conductive primer layer.

The pixel definition layer may include a first bank portion having a first bank thickness, and a second bank portion having a second bank thickness that is greater than the first bank thickness.

The conductive primer layer may be on an upper surface of the hole injection layer and on an upper surface of the first bank portion.

The conductive primer layer may have a thickness corresponding to a wavelength of a light emitted from the organic light-emitting layer.

Embodiments of the present invention provide a method of manufacturing an organic electroluminescent display, the method including forming a pixel electrode on a substrate, forming a pixel definition layer having an opening therein on the pixel electrode to expose the pixel electrode through the opening, forming a hole injection layer on the pixel electrode, forming a conductive primer layer, which is more lyophilic than the hole injection layer, on the hole injection layer by providing a primer solution in the opening, and curing the primer solution, forming a hole transfer layer on the conductive primer layer, forming an organic light-emitting layer on the hole transfer layer, and forming a common electrode on the organic light-emitting layer.

The primer solution may be provided entirely within the opening.

The forming of the hole transfer layer may include providing a source solution in the opening, and curing the source solution.

The source solution may be provided on an entirety of the conductive primer layer.

The curing of the primer solution may include curing the primer solution using a light, and heat-treating the primer solution.

The forming of the pixel definition layer may include forming a photoresist layer on the pixel electrode, and controlling an amount of light irradiated onto areas of the photoresist layer to form a first bank portion having a first bank thickness and a second bank portion having a second bank thickness.

The conductive primer layer may cover an upper surface of the hole injection layer and an upper surface of the first bank portion.

A thickness of the conductive primer layer may correspond to a wavelength of a light emitted from the organic light-emitting layer, wherein a longer wavelength corresponds to a thicker conductive primer layer.

According to the above, the conductive primer layer is formed by curing the primer solution provided inside the opening in the pixel definition layer. In addition, the conductive primer layer has lyophilic tendencies to an extent greater than that of the hole injection layer located under the conductive primer layer, and thus, the liquid organic material may be uniformly provided on the conductive primer layer. Thus, the hole transfer layer may be easily formed by curing the liquid organic material.

BRIEF DESCRIPTION OF THE DRAWINGS

The above and other aspects of embodiments of the present invention will become readily apparent by reference to the following detailed description when considered in conjunction with the accompanying drawings wherein.

DETAILED DESCRIPTION

It will be understood that when an element or layer is referred to as being "on", "connected to," or "coupled to" another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of embodiments of the present invention.

Spatially relative terms, such as "beneath", "below", "lower", "above", "upper," and the like may be used herein for ease of description to describe one element's or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments only, and is not intended to be limiting of the invention. As used herein, the singular forms, "a", "an," and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments of the present invention belong. It will be further understood that terms, such as those defined in commonly used dictionaries, should be interpreted as having a meaning that is consistent with their meaning in the context of the relevant art, and will not be interpreted in an idealized or overly formal sense unless expressly so defined herein.

Hereinafter, embodiments of the present invention will be explained in detail with reference to the accompanying drawings.

Figure 1:
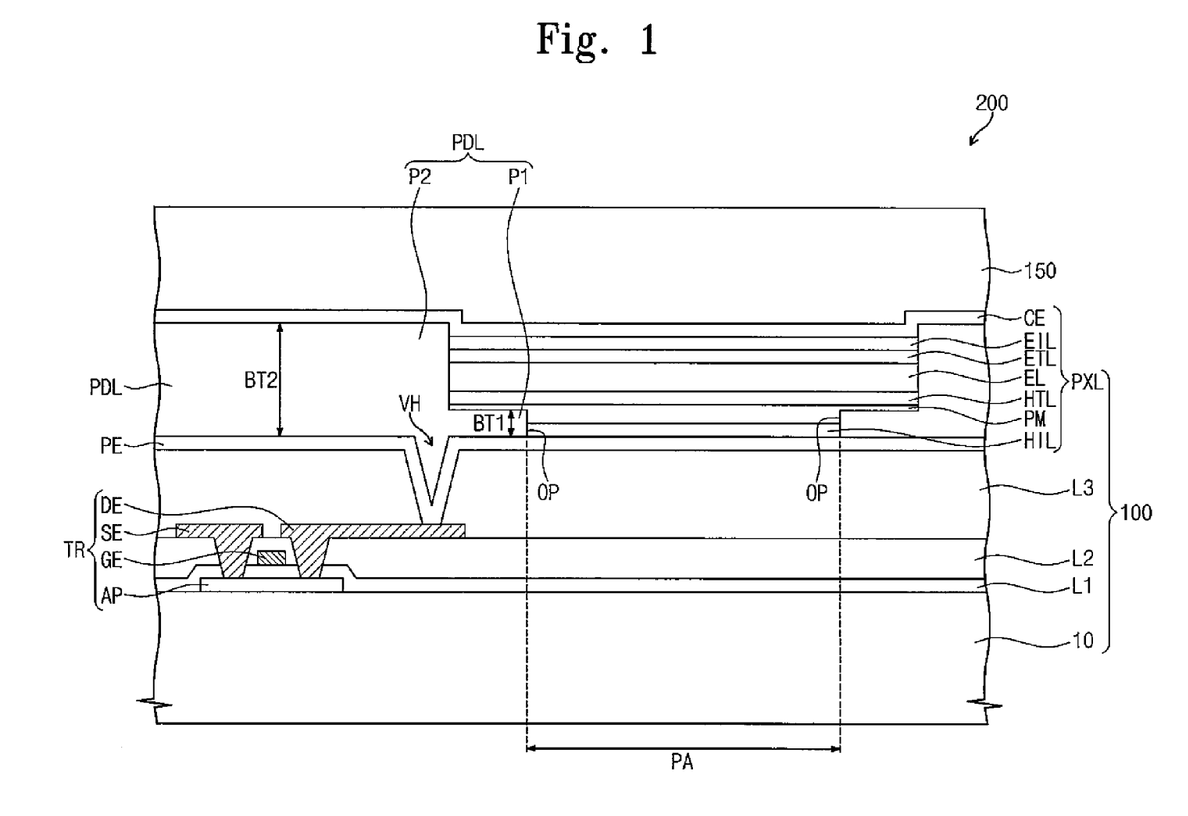
FIG. 1 is a cross-sectional view showing a pixel of an organic electroluminescent display according to an exemplary embodiment of the present invention.

FIG. 1 is a cross-sectional view showing a pixel of an organic electroluminescent display according to an exemplary embodiment of the present invention. The organic electroluminescent display 200 includes a plurality of pixels, although one pixel PXL in a pixel area PA will be described in detail with reference to FIG. 1, because the pixels of the plurality have substantially the same structure and function.

Referring to FIG. 1, the organic electroluminescent display 200 includes a display substrate 100 and an opposite substrate 150 facing the display substrate 100. The display substrate 100 includes a substrate 10, a driving transistor TR, a pixel definition layer PDL, and the pixel PXL.

The driving transistor TR is located on the substrate 10, and is electrically coupled to a pixel electrode PE to selectively allow a source signal applied to the pixel electrode PE. The driving transistor TR includes a gate electrode GE, an active pattern AP, a source electrode SE, and a drain electrode DE. The source electrode SE is electrically coupled to a source line that transmits the source signal, and the drain electrode DE is electrically coupled to the pixel electrode PE. Accordingly, when the driving transistor TR is turned on, the source signal applied to the source line is applied to the pixel electrode PE through the driving transistor TR.

A gate insulating layer L1 covers the active pattern AP to insulate the gate electrode GE from the active pattern AP, and an inter-insulating layer L2 covers the gate electrode GE to insulate the gate electrode GE from the source electrode SE and from the drain electrode DE. In addition, a cover layer L3 covers the driving transistor TR and has a via hole VH formed therethrough. Thus, the pixel electrode PE on the cover layer L3 is electrically coupled to the pixel electrode PE through the via hole VH.

The pixel definition layer PDL is located on the pixel electrode PE and has an opening OP formed therethrough to correspond to the pixel area PA. In the present exemplary embodiment, the pixel definition layer PDL includes a first bank portion P1 having a first bank thickness BT1 and a second bank portion P2 having a second bank thickness BT2 that is greater than the first bank thickness BT1. Therefore, a thickness uniformity of a conductive primer layer PM in the pixel area PA is improved, as will be described in detail later.

The pixel PXL includes the pixel electrode PE, a hole injection layer HIL, the conductive primer layer PM, a hole transfer layer HTL, an organic light-emitting layer EL, an electron transfer layer ETL, an electron injection layer EIL, and a common electrode CE. The pixel electrode PE is disposed in the pixel area PA. In the present exemplary embodiment, the pixel electrode PE may be an anode electrode of the pixel PXL. When the organic electroluminescent display 200 is a front surface light-emitting type, the pixel electrode PE includes a metal layer (e.g., an aluminum layer) to be light reflective. In addition, when the organic electroluminescent display 200 is a rear surface light-emitting type, the pixel electrode PE includes a transparent conductive layer (e.g., a layer of indium tin oxide) to be light transmissive, or the pixel electrode PE may include a metal layer together with the transparent conductive layer to have a light-transflective property.

The hole injection layer HIL, the conductive primer layer PM, the hole transfer layer HTL, the organic light-emitting layer EL, the electron transfer layer ETL, the electron injection layer EIL, and the common electrode CE are sequentially stacked on the pixel electrode PE. When the pixel electrode PE and the common electrode CE respectively serve as the anode electrode and the cathode electrode, holes that are injected through the pixel electrode PE are provided to the organic light-emitting layer EL through the hole injection layer HIL, the conductive primer layer PM, and the hole transfer layer HTL, and electrons that are injected through the common electrode CE are provided to the organic light-emitting layer EL through the electron injection layer EIL and the electron transfer layer ETL. Accordingly, the light is emitted from the organic light-emitting layer EL due to energy generated by the recombination of the holes and the electrons provided to the organic light-emitting layer EL.

In the present exemplary embodiment shown in FIG. 1, the organic light-emitting layer EL is located on the hole transfer layer HTL to emit light (e.g., light having a predetermined color), although other embodiments of the present invention are not limited to the organic light-emitting layer EL having the above-mentioned structure. For instance, the organic light-emitting layer EL may be formed to cover the entire area of the substrate 10. When the organic light-emitting layer EL covers the entire area of the substrate 10, to define colors of the lights exiting from the pixels arranged in the pixel areas, color filters may be located on the substrate 10 to allow light exiting from the organic light-emitting layer EL to have different colors (e.g., predetermined colors).

The conductive primer layer PM has conductivity and is between the hole injection layer HIL and the hole transfer layer HTL. In the present exemplary embodiment, the conductive primer layer PM has higher lyophilic tendencies than those of the hole injection layer HIL. For instance, the hole injection layer HIL includes a water soluble material, the conductive primer layer PM includes organic material, and the hole transfer layer HTL is formed by curing a liquid organic material. Because the conductive primer layer PM has the higher lyophilic property, when compared to the hole injection layer HIL, the liquid organic material has superior wettability with respect to the conductive primer layer PM when compared to the hole injection layer HIL. Thus, the liquid organic material may be uniformly formed on the conductive primer layer PM. As a result, the hole transfer layer HTL, which is formed by curing the liquid organic material, may have uniform (e.g., substantially uniform) thickness.

In the present exemplary embodiment, the conductive primer layer PM is accommodated in the opening OP, and is located only in the opening OP. In addition, the conductive primer layer PM is not only on the hole injection layer HIL, but is also on an upper surface of the first bank portion P1. In the present embodiment, the conductive primer layer PM may have an upper surface that is larger than a bottom surface thereof by an area equal to an area of the upper surface of the first bank portion P1, and thus the thickness of the conductive primer layer PM may be uniform. The structure of the conductive primer layer PM is related to the manufacturing method of the conductive primer layer PM, which will be described in detail later with reference to FIGS. 3D and 3E.

According to another embodiment of the present invention, the pixel definition layer PDL may have a single-bank thickness (e.g., BT1=0) as long as the conductive primer layer PM may be manufactured to have uniform thickness.

The common electrode CE is located on the electron injection layer EIL, and may be the cathode electrode of the pixel PXL. When the organic electroluminescent display 200 is of the rear surface light-emitting type, the common electrode CE includes a metal layer (e.g., an aluminum layer) to have properties of light reflectance. In addition, when the organic electroluminescent display 200 is the front surface light-emitting type, the common electrode CE includes a transparent conductive layer (e.g., a layer of indium tin oxide) to have properties of light transmission, or may include a metal layer and the transparent conductive layer to have a light-transflective property.

Figure 2:
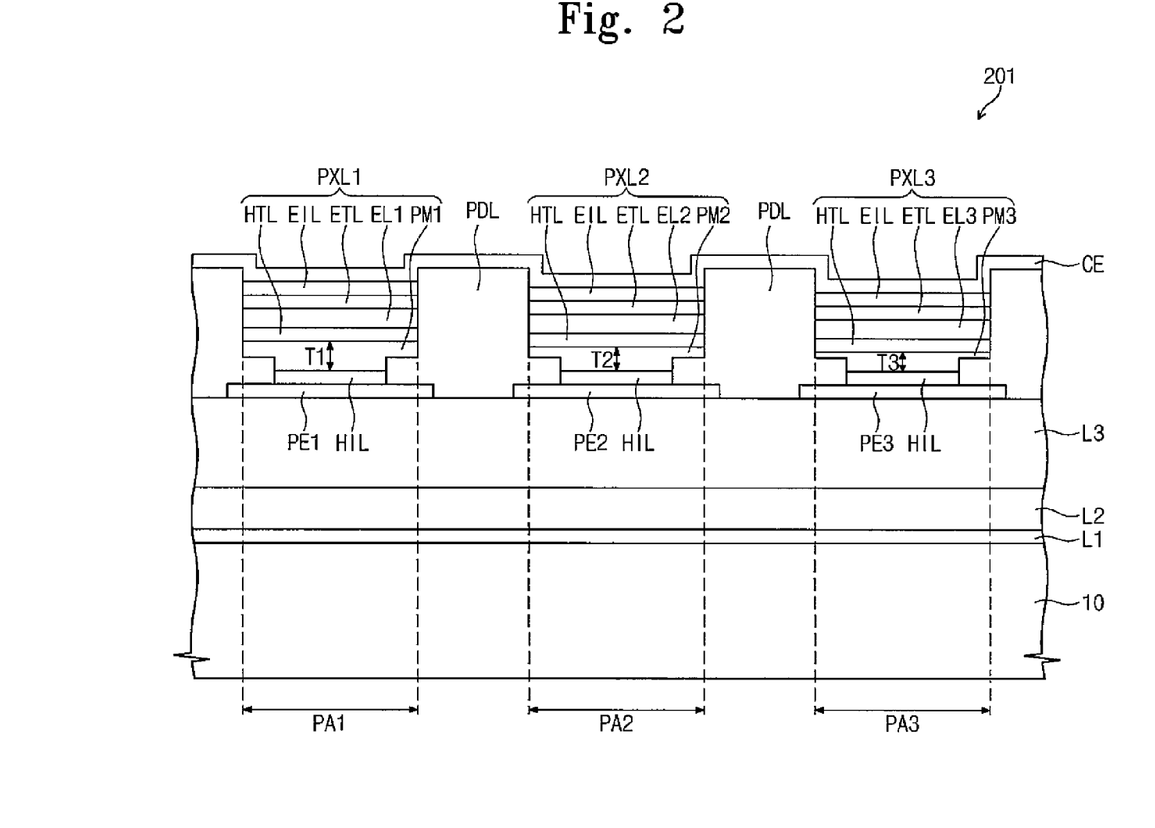
FIG. 2 is a cross-sectional view showing an organic electroluminescent display according to another exemplary embodiment of the present invention.

FIG. 2 is a cross-sectional view showing an organic electroluminescent display according to another exemplary embodiment of the present invention. In FIG. 2, same reference numerals denote the elements shown in FIG. 1, and thus detailed descriptions of the same elements will be omitted.

Referring to FIG. 2, an organic electroluminescent display 201 includes a first pixel PXL1 in a first pixel area PA1, a second pixel PXL2 in a second pixel area PA2, and a third pixel PXL3 in a third pixel area PA3.

First, second, and third pixel electrodes PE1, PE2, and PE3 are respectively located in the first, second, and third pixel areas PA1, PA2, and PA3. The first pixel PXL1 includes a first conductive primer layer PM1 and a first organic light-emitting layer EL1, the second pixel PXL2 includes a second conductive primer layer PM2 and a second organic light-emitting layer EL2, and the third pixel PXL3 includes a third conductive primer layer PM3 and a third organic light-emitting layer EL3.

In the present exemplary embodiment, the first to third pixels PXL1, PXL2, and PXL3 emit differently colored light. For instance, the first organic light-emitting layer EL1 of the first pixel PXL1 may emit a red light, the second organic light-emitting layer EL2 of the second pixel PXL2 may emit a green light, and the third organic light-emitting layer EL3 of the third pixel PXL3 may emit a blue light.

As described above, when the first to third organic light-emitting layers EL1, EL2, and EL3 emit light with different colors, the first to third conductive primer layers PM1, PM2, and PM3 have different thicknesses, so that the first to third pixels PXL1, PXL2, and PXL3 may be operated in a resonance mode.

When the first to third pixels PXL1 to PXL3 are operated in the resonance mode, constructive interference of the lights exiting from the first to third pixels PXL1 to PXL3 improves optical properties of the organic electroluminescent display 201. When assuming that a wavelength of the light emitted from the organic light-emitting layer of one of the first to third pixels PXL1 to PXL3 is $\lambda$, the pixel may be operated in the resonance mode when the thickness of layers interposed between the common electrode CE and one of the first, the second and the third pixel electrodes PE1, PE2 and PE3 in the pixel is set to be a multiple of half of the wavelength (i.e., integer times of $\lambda/2$, or $n*\lambda/2$).

Accordingly, when the red light, the green light, and the blue light are respectively emitted from the first organic light-emitting layer EL1, the second organic light-emitting layer EL2, and the third organic light-emitting layer EL3, the wavelength of the red light is longest, and the wavelength of the blue light is shortest. Thus, to operate the first to third pixels PXL1 to PXL3 in the resonance mode, of the three thicknesses T1, T2, and T3, a first thickness T1 of the first conductive primer layer PM1 may be largest, a third thickness T3 of the third conductive primer layer PM3 may be smallest, and a second thickness T2 of the second conductive primer layer PM2 may be greater than the third thickness T3 and smaller than the first thickness T1. That is, the first, second, and third pixels PXL1, PXL2, and PXL3 may be operated in the resonance mode by adjusting the first, second, and third thicknesses T1, T2, and T3 of the first, second, and third conductive primer layers PM1, PM2, and PM3.

When compared to a conventional organic electroluminescent display that is operated in the resonance mode using an auxiliary layer, the organic electroluminescent display 201 according to the present exemplary embodiment may be operated in the resonance mode by using the first to third conductive primer layers PM1 to PM3 instead of using the auxiliary layer. Therefore, although the organic electroluminescent display 201 according to the present exemplary embodiment does not employ the auxiliary layer, the organic electroluminescent display 201 according to the present exemplary embodiment may operate in the resonance mode by using the first to third conductive primer layers PM1 to PM3.

FIGS. 3A to 3F are cross-sectional views showing a method of manufacturing the organic electroluminescent display shown in FIG. 1. In FIGS. 3A to 3F, same reference numerals denote the elements shown in FIG. 1, and thus detailed descriptions of the same elements will be omitted.

Figure 3A:
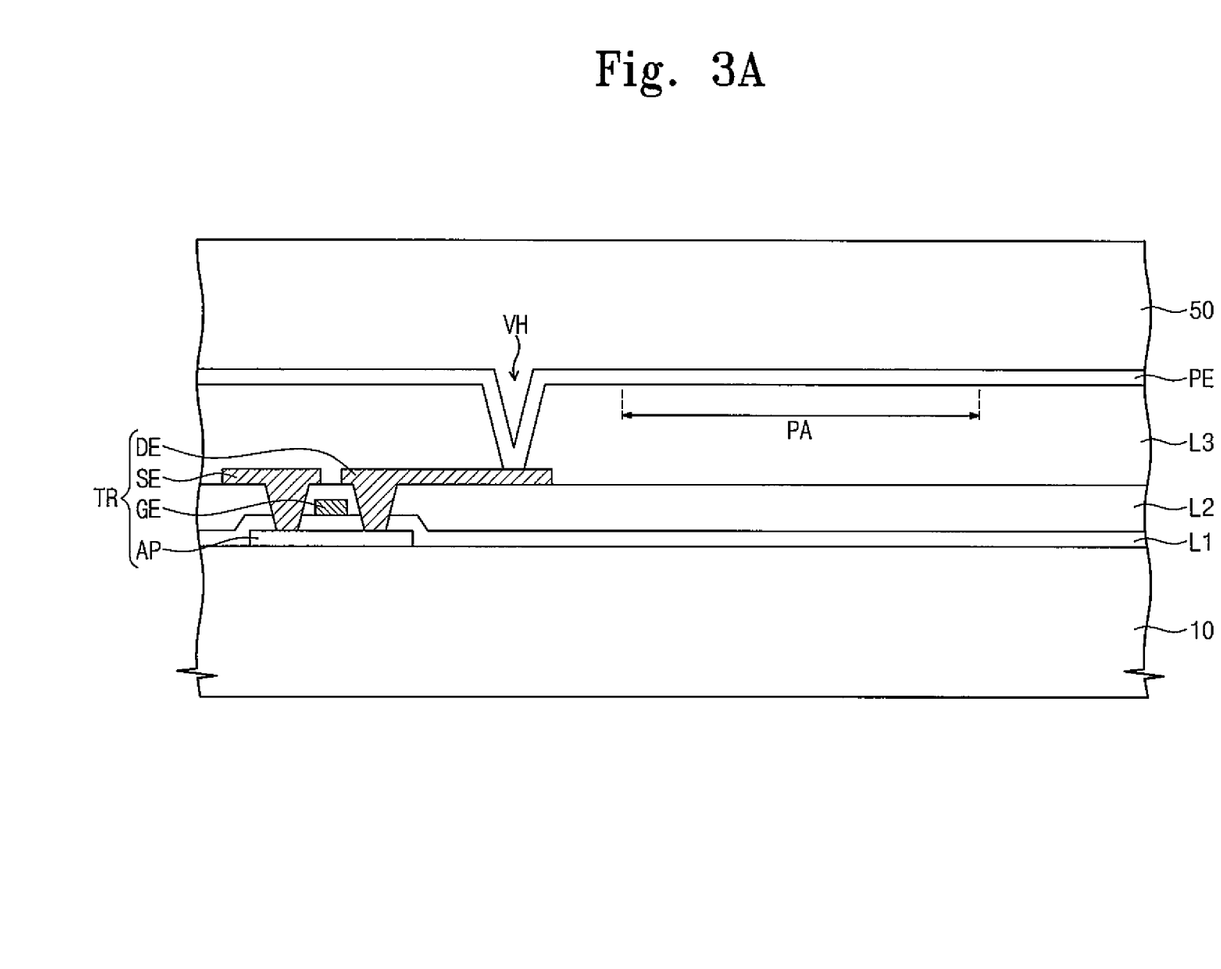
FIGS. 3A to 3F are cross-sectional views showing a method of manufacturing the organic electroluminescent display of the embodiment shown in FIG. 1, according to an embodiment of the present invention.

Referring to FIG. 3A, the driving transistor TR is formed on the substrate 10, and the cover layer L3 is formed to cover the driving transistor TR. Then, the via hole VH is formed in, or penetrating through, the cover layer L3 to expose the drain electrode DE of the driving transistor TR, and the pixel electrode PE is formed on the cover layer L3 and a portion of the drain electrode DE. Thus, the pixel electrode PE makes contact with the drain electrode DE of the driving transistor TR through the via hole VH.

Then, a photoresist layer 50 is formed on the pixel electrode PE. The photoresist layer 50 is used to form the pixel definition layer PDL (refer to FIG. 1) through a patterning process described below.

Figure 3B:
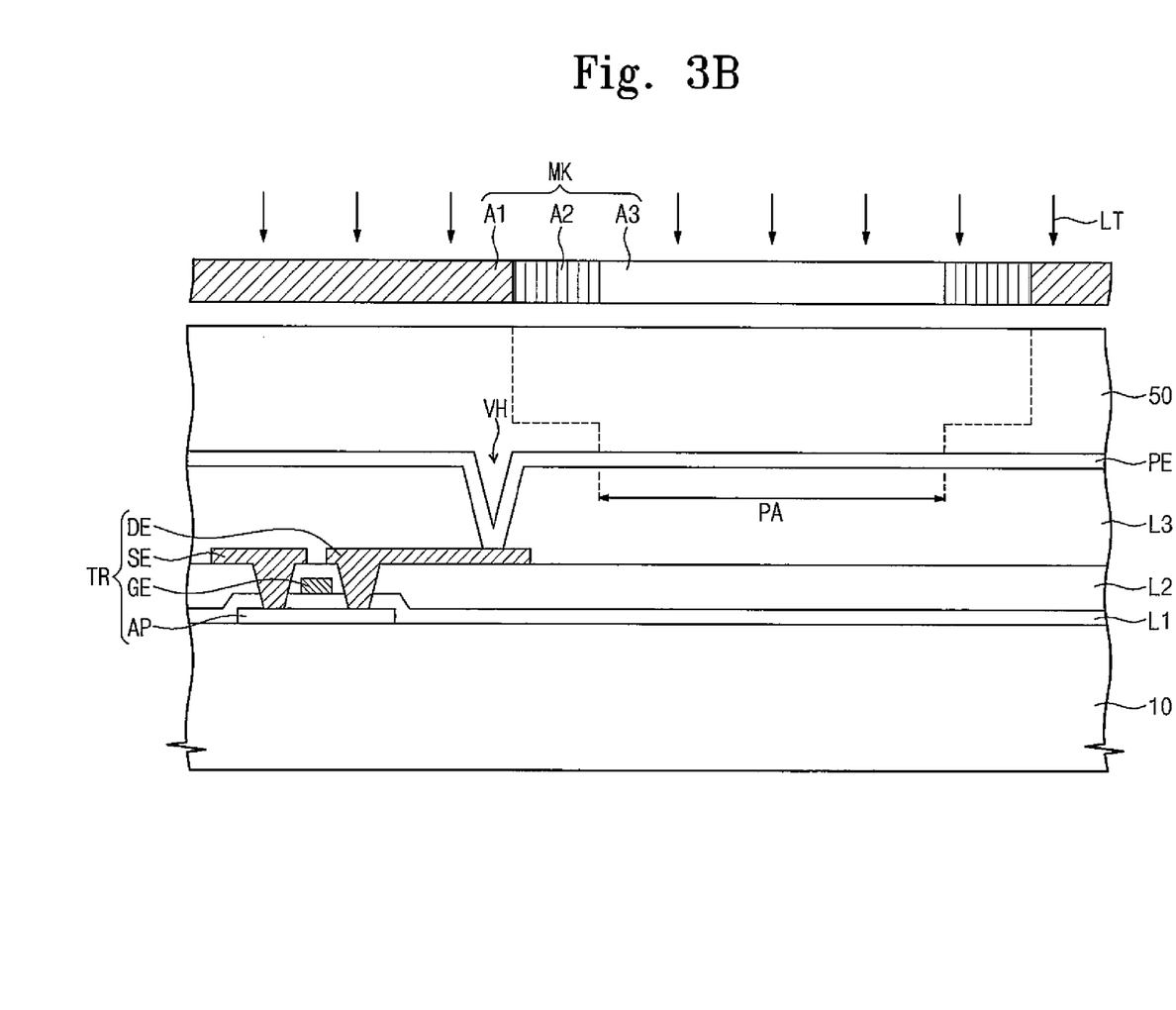
Figure 3C:
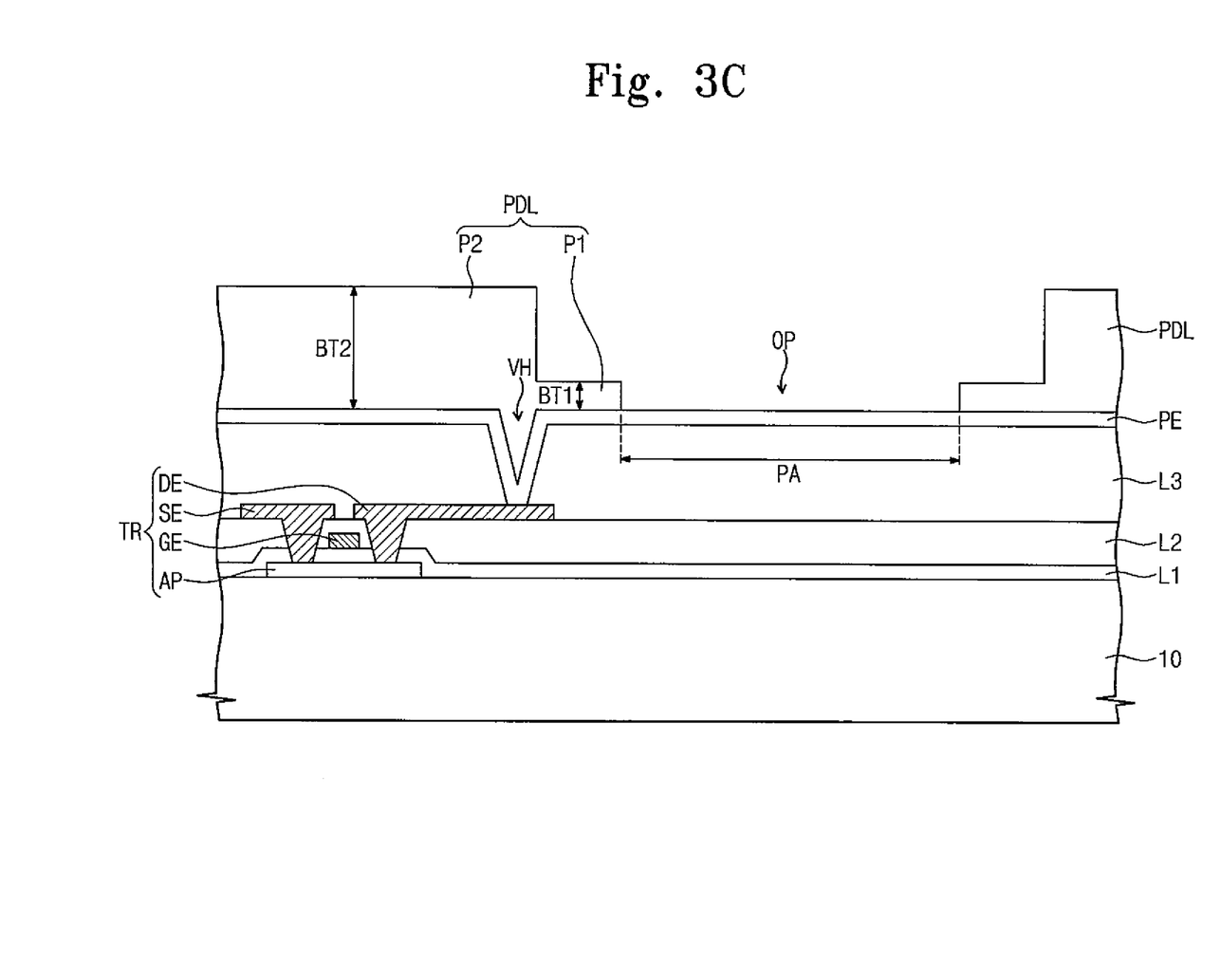

Referring to FIGS. 3B and 3C, a mask MK is positioned on or above the photoresist layer 50, and the photoresist layer 50 is exposed to a light LT (e.g., selectively exposed) using the mask MK. In the present exemplary embodiment, the mask MK is a slit mask, and thus, the mask MK includes a light-blocking area A1, a semi-transmitting area A2, and a light-transmitting area A3. The light-blocking area A1 blocks the light LT, the light-transmitting area A3 transmits the light LT, and the semi-transmitting area A2 transmits a portion of the light LT. The light-blocking area A1 is positioned to correspond to the second bank P2, the semi-transmitting area A2 is positioned to correspond to the first bank P1, and the light-transmitting area A3 is positioned to correspond to the opening OP formed through the pixel definition layer PDL.

When the photoresist layer 50 is exposed to the light LT using the mask MK having the above-mentioned structure, the amount of the light LT irradiated onto the photoresist layer 50 corresponds to the areas A1, A2, and A3. Accordingly, when the photoresist layer 50 is developed after the exposure process is performed on the photoresist layer 50, the pixel definition layer PDL is formed to include the first bank portion P1 with the first bank thickness BT1 and the second bank portion P2 with the second bank thickness BT2 that is greater than the first bank thickness BT1 according to the amount of the light LT received in each area A1, A2, and A3. In addition, the pixel definition layer PDL includes the opening OP formed by removing a portion of the pixel definition layer PDL corresponding to the pixel area PA, and thus the pixel electrode PE is exposed through the opening OP in the pixel area PA.

Figure 3D:
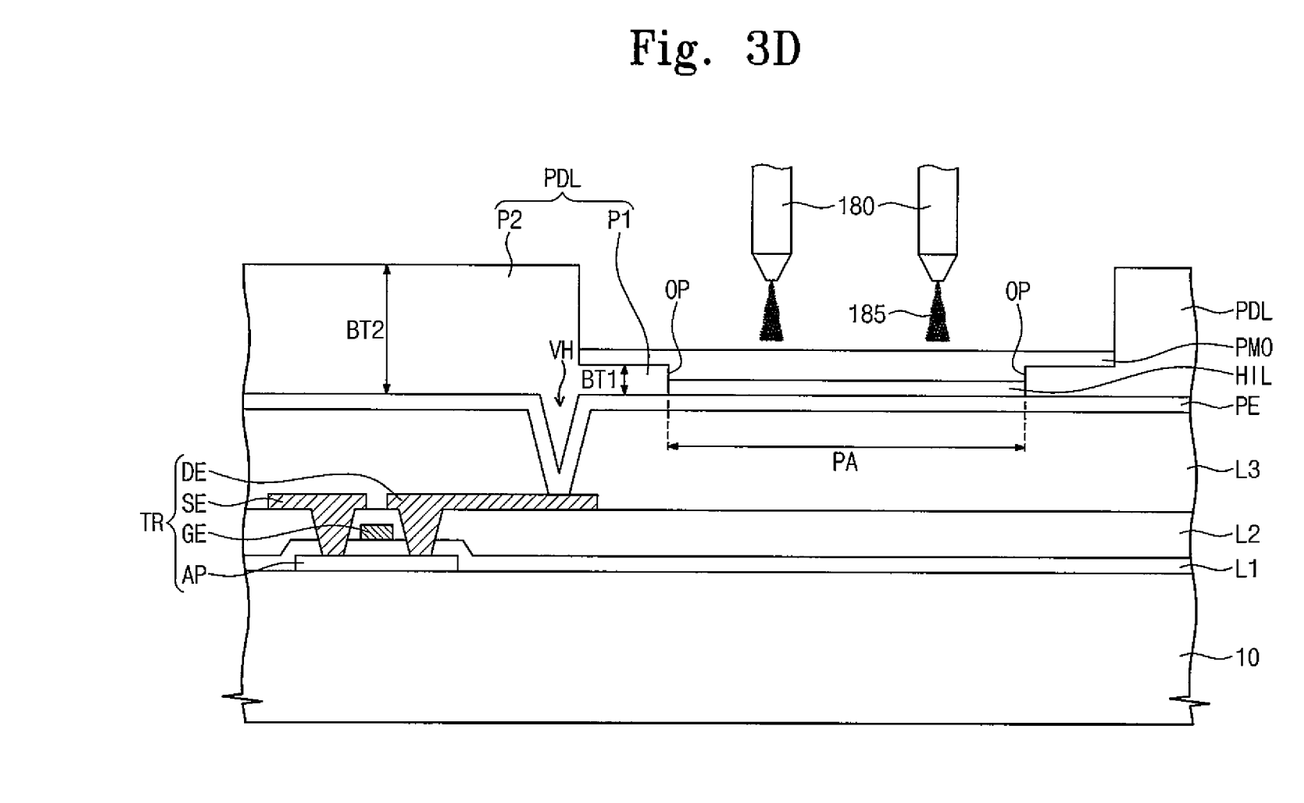

Referring to FIG. 3D, the hole injection layer HIL is formed on the pixel electrode PE, and a primer solution 185 is provided on the hole injection layer HIL using nozzles 180 to form a preliminary primer layer PMO. In detail, the nozzles 180 provide the primer solution 185 inside the opening OP so as to form the preliminary primer layer PMO on the hole injection layer HIL.

In the present exemplary embodiment, when the primer solution 185 is provided on the hole injection layer HIL, the primer solution 185 covers not only the upper surface of the hole injection layer HIL but also the upper surface of the first bank portion P1. Thus, the preliminary primer layer PMO may expand by the area of the upper surface of the first bank portion P1, and thus the thickness of the conductive primer layer PM may be uniform.

Figure 3E:
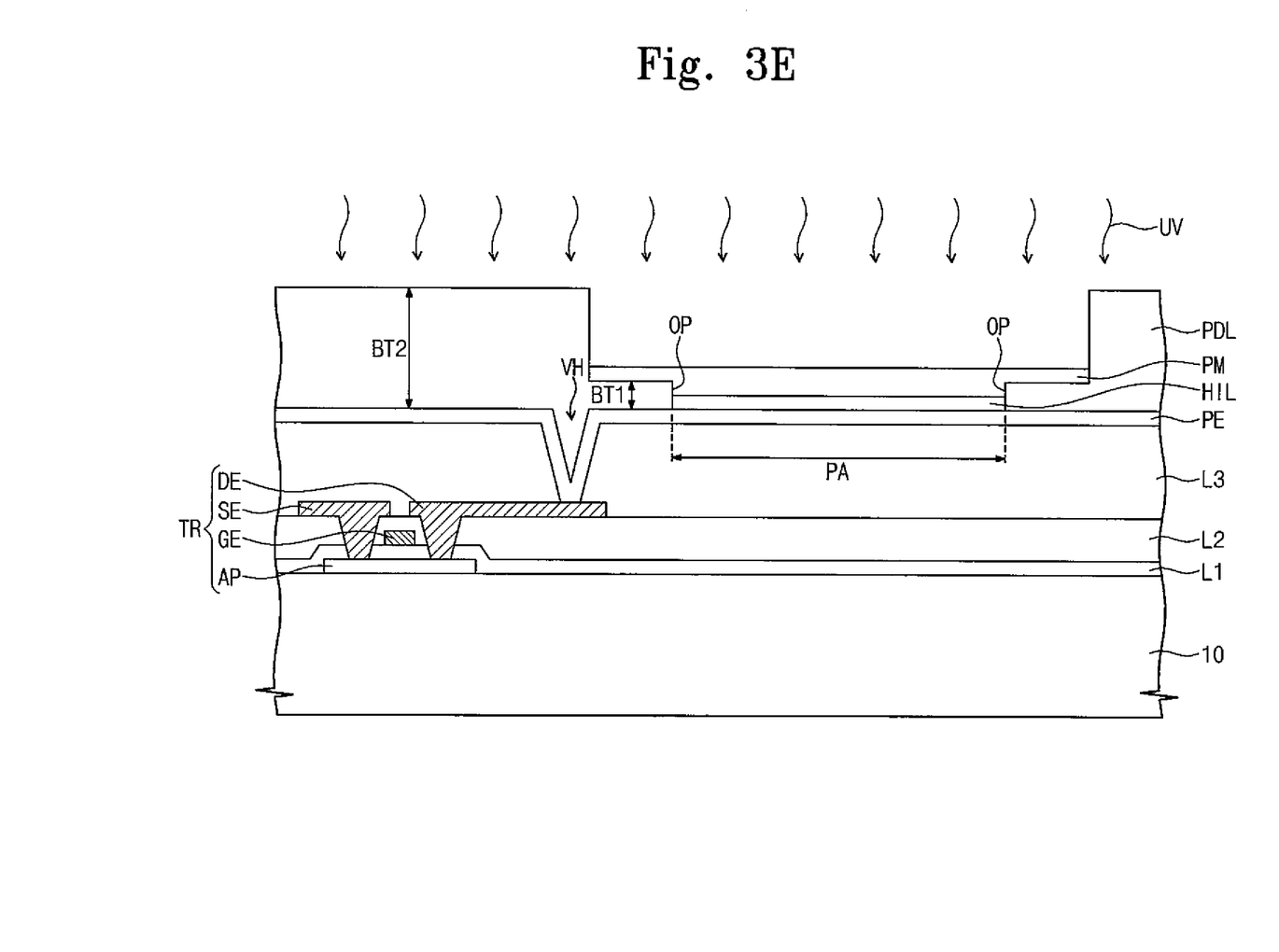

Referring to FIG. 3E, after the preliminary primer layer PMO (refer to FIG. 3D) is formed, the preliminary primer layer PMO is cured to form the conductive primer layer PM. In the present exemplary embodiment, the preliminary primer layer PMO is first cured by irradiation of an ultraviolet ray UV onto the preliminary primer layer PMO, and the firstly-cured preliminary primer layer is then additionally cured by heating the firstly-cured preliminary primer layer, thereby forming the conductive primer layer PM.

As described with reference to FIG. 3D, the position at which the preliminary primer layer PMO is formed is controlled when the preliminary primer layer PMO is formed, and the conductive primer layer PM is formed by curing the preliminary primer layer PMO. Therefore, although a separate patterning process is not performed on the conductive primer layer PM, the position at which the preliminary primer layer PMO is formed may be precisely controlled.

Figure 3F:
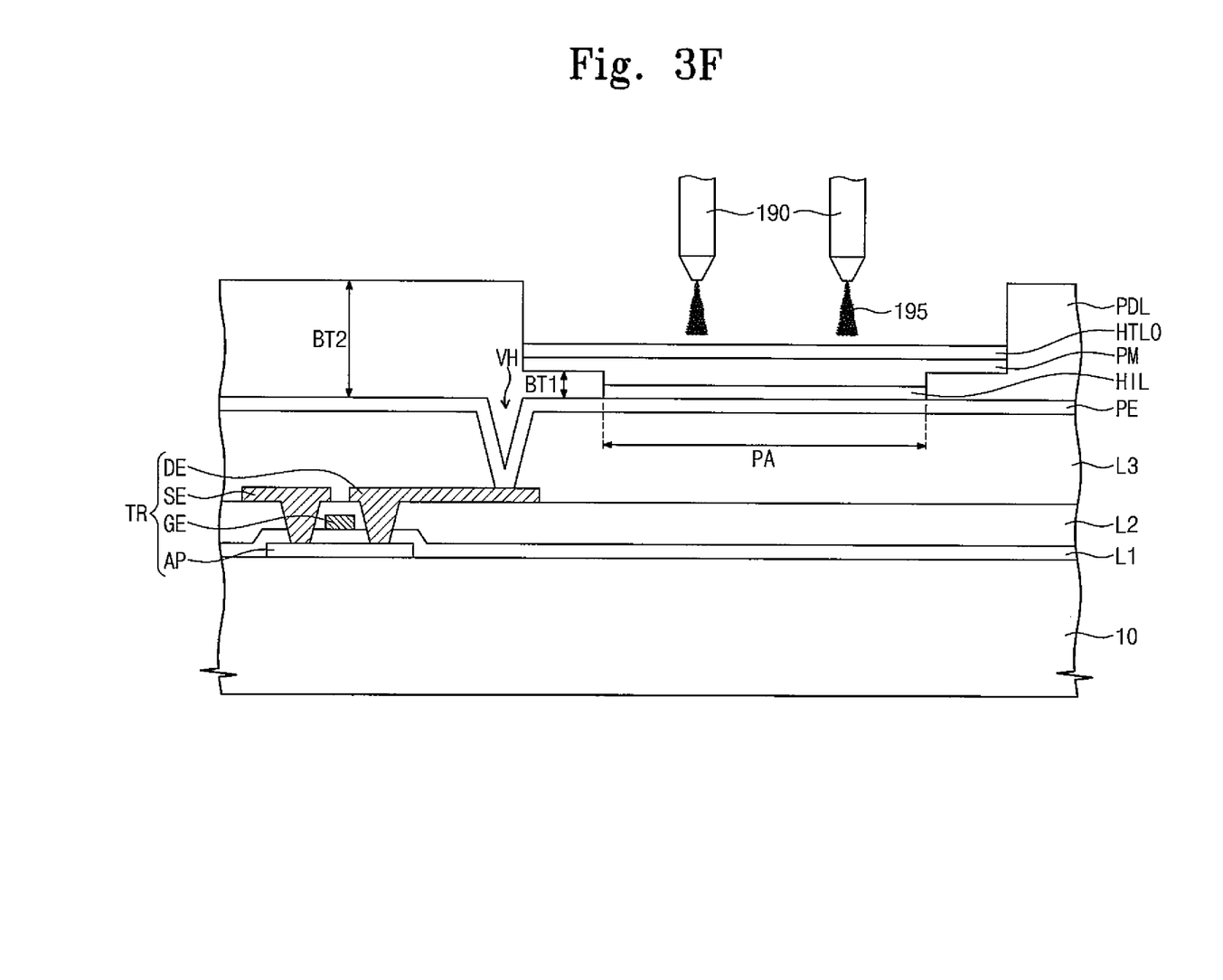

Referring to FIGS. 1 and 3F, after the conductive primer layer PM is formed, a source solution 195 is provided inside the opening OP using nozzles 190 to form a preliminary hole transfer layer HTLO on the conductive primer layer PM.

Meanwhile, as described with reference to FIG. 1, the conductive primer layer PM has the more lyophilic property (when compared to the hole injection layer HIL), and the source solution 195 has superior wettability with respect to the hole transfer layer HTL (as compared to the hole injection layer HIL). Thus, the preliminary hole transfer layer HTLO formed of the source solution 195 may be uniformly formed on the conductive primer layer PM.

Then, the preliminary hole transfer layer HTLO is cured to form the completed, or finalized, hole transfer layer HTL. In the present embodiment, the preliminary hole transfer layer HTLO is cured by using one of light and heat.

In the present exemplary embodiment, the position at which the preliminary hole transfer layer HTLO is formed is controlled while the preliminary hole transfer layer HTLO is formed, and the hole transfer layer HTL is formed by curing the preliminary hole transfer layer HTLO. Accordingly, although a separate patterning process is not performed on the hole transfer layer HTL, the position at which the hole transfer layer HTL is formed may be precisely controlled.

Although not shown in figures, after the hole transfer layer HTL is formed, the organic light-emitting layer EL, the electron transfer layer ETL, the electron injection layer EIL, and the common electrode CE are sequentially formed on the hole transfer layer HTL, thereby completing the pixel PXL. After that, the opposite substrate 150 is coupled to the substrate 10, on which the pixel PXL is formed, such that the pixel PXL is blocked, or sealed, from the exterior/external environment, and thus the organic electroluminescent display 200 is manufactured.

Although exemplary embodiments of the present invention have been described, it is understood that the present invention should not be limited to these exemplary embodiments, as various changes and modifications can be made by one ordinary skilled in the art within the spirit and scope of the present invention as hereinafter claimed by the claims and their equivalents.

What is claimed is:
1. An organic electroluminescent display comprising:
a substrate having a pixel area;
a pixel definition layer having an opening corresponding to the pixel area;
a pixel electrode in the pixel area;
a hole injection layer on the pixel electrode;

a conductive primer layer in the opening and on the hole injection layer, the conductive primer layer being more lyophilic than the hole injection layer;

a hole transfer layer in the opening and on the conductive primer layer;

an organic light-emitting layer on the hole transfer layer; and a common electrode on the organic light-emitting layer.

2. The organic electroluminescent display of claim 1, wherein the conductive primer layer is entirely within the opening.

3. The organic electroluminescent display of claim 2, wherein the hole transfer layer is on an entirety of the conductive primer layer.

4. The organic electroluminescent display of claim 1, wherein the pixel definition layer comprises:

a first bank portion having a first bank thickness; and a second bank portion having a second bank thickness that is greater than the first bank thickness.

5. The organic electroluminescent display of claim 4, wherein the conductive primer layer is on an upper surface of the hole injection layer and on an upper surface of the first bank portion.

6. The organic electroluminescent display of claim 1, wherein the conductive primer layer has a thickness corresponding to a wavelength of a light emitted from the organic light-emitting layer.

7. A method of manufacturing an organic electroluminescent display, the method comprising:

forming a pixel electrode on a substrate;

forming a pixel definition layer having an opening therein on the pixel electrode to expose the pixel electrode through the opening;

forming a hole injection layer on the pixel electrode;

forming a conductive primer layer, which is more lyophilic than the hole injection layer, on the hole injection layer by providing a primer solution in the opening, and curing the primer solution;

forming a hole transfer layer on the conductive primer layer;

forming an organic light-emitting layer on the hole transfer layer; and forming a common electrode on the organic light-emitting layer.

8. The method of claim 7, wherein the primer solution is provided entirely within the opening.

9. The method of claim 7, wherein the forming of the hole transfer layer comprises:

providing a source solution in the opening; and curing the source solution.

10. The method of claim 9, wherein the source solution is provided on an entirety of the conductive primer layer.

11. The method of claim 7, wherein the curing of the primer solution comprises:

curing the primer solution using a light; and heat-treating the primer solution.

12. The method of claim 7, wherein the forming of the pixel definition layer comprises:

forming a photoresist layer on the pixel electrode; and controlling an amount of light irradiated onto areas of the photoresist layer to form a first bank portion having a first bank thickness and a second bank portion having a second bank thickness.

13. The method of claim 12, wherein the conductive primer layer covers an upper surface of the hole injection layer and an upper surface of the first bank portion.

14. The method of claim 7, wherein a thickness of the conductive primer layer corresponds to a wavelength of a light emitted from the organic light-emitting layer, wherein a longer wavelength corresponds to a thicker conductive primer layer.

\* \* \* \* \*